(12) United States Patent
Abe

(10) Patent No.: US 6,252,219 B1
(45) Date of Patent: Jun. 26, 2001

(54) SOLID-STATE IMAGING ELEMENT

(75) Inventor: Hideshi Abe, Kanawaga (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/289,546

(22) Filed: Apr. 12, 1999

(30) Foreign Application Priority Data

Apr. 15, 1998 (JP) .................................................. 10-104949

(51) Int. Cl.$^7$ .................................................. H01L 27/14
(52) U.S. Cl. .................................. 250/208.1; 250/214.1; 257/432
(58) Field of Search .............................. 250/208.1, 216, 250/214.1; 257/432, 431

(56) References Cited

U.S. PATENT DOCUMENTS

| | | | | |
|---|---|---|---|---|
| 5,321,297 | * | 6/1994 | Enomotto | 257/432 |
| 5,371,397 | * | 12/1994 | Maegawa et al. | 257/432 |
| 5,633,527 | * | 5/1997 | Lear | 257/432 |
| 5,691,548 | * | 11/1997 | Akio | 257/232 |
| 5,711,890 | * | 1/1998 | Hawkins et al. | 216/24 |
| 5,734,190 | * | 3/1998 | Hawkins et al. | 257/432 |
| 5,796,154 | * | 8/1998 | Sano et al. | 257/432 |
| 6,069,350 | * | 5/2000 | Ohtsuka et al. | 250/208.1 |
| 6,104,021 | * | 8/2000 | Ogawa | 250/208.1 |

* cited by examiner

Primary Examiner—John R. Lee
(74) Attorney, Agent, or Firm—Sonnenschein, Nath & Rosenthal

(57) ABSTRACT

A solid-state imaging element is able to maximize a sensitivity relative to various kinds of light sources having different incident angles. In a solid-state imaging element (20), a maximum inclination angle (max of a curved surface ($S_L$) of an interlayer lens (11) relative to a surface ($S_S$) parallel to a surface of a substrate (2) is set to an angle near a critical angle ($\theta c$) of a total reflection.

5 Claims, 4 Drawing Sheets

SOLID-STATE IMAGING ELEMENT

BACKGROUND OF THE INVENTION

RELATED APPLICATION DATA

The present application claims priority to Japanese Application No. P10-104949 filed Apr. 15, 1998 which application is incorporated herein by reference to the extent permitted by law.

1. Field of the Invention

The present invention relates to a solid-state imaging element having a concave lens structure (interlayer lens) formed therein.

2. Description of the Related Art

In accordance with an increasing demand of miniaturizing an element, recent color solid-state imaging elements come to have a so-called on-chip lens structure in which a microlens is formed on the upper portion of the element and are able to improve sensitivity in a sensor (light-receiving portion) by focusing an incident light with this microlens.

Some solid-state imaging element having the above-mentioned on-chip lens structure further includes a second lens structure having a light condenser characteristic, i.e. interlayer lens formed between the microlens on the surface and the light-receiving portion.

As this interlayer lens structure, there are enumerated a concave lens structure in which a boundary surface between two layers having different refractive indexes is formed as a concave surface on which a concave lens is formed.

In a CCD (charge-coupled device) solid-state imaging element in which the interlayer lens mentioned above is formed, although the interlayer lens should preferably be shaped such that sensitivity may become maximum, lights having various incident angles become incident on the CCD solid-state imaging element depending upon a value of stop (F number) of a camera lens system.

When the F number is large, for example, the incident light is narrowed so that it becomes approximately a vertical light. At that time, a quantity of the incident light decreases.

When on the other hand the F number is small, the incident light is widened so that an oblique light component increases. At that time, a quantity of incident light increases.

However, when a light becomes incident on the curved surface of the interlayer lens from the oblique direction, depending upon its incident angle, the light is totally reflected on the concave surface of the interlayer lens and cannot reach the light-receiving portion. There is then the risk that an improvement of sensitivity becomes insufficient.

Also, with respect to the on-chip lens of the same shape, when the F number of the camera changes, a quantity of oblique light component changes so that sensitivity becomes different.

Therefore, in order to obtain the standards for determining a shape in which sensitivity may become maximum, trial products of interlayer lens have heretofore been manufactured and trial and error have been made.

Then, the optimum shape of interlayer lens capable of avoiding the aforementioned problems and which can sufficiently improve sensitivity has not been yet clarified up to now.

SUMMARY OF THE INVENTION

In view of the aforesaid aspect, it is an object of the present invention to provide a solid-state imaging element which can maximize sensitivity relative to a variety of light sources having different incident angles.

According to an aspect of the present invention, there is provided a solid-state imaging element in which a maximum inclination angle of a curved surface of an interlayer lens relative to a surface parallel to a substrate surface is set to an angle near a critical angle of a total reflection.

According to another aspect of the present invention, there is provided a solid-state imaging element which is comprised of a substrate, a light-receiving portion formed within the substrate, an interlayer insulator formed so as to have a concave portion above the light-receiving portion, and a high refractive index layer having a refractive index larger than that of the interlayer insulator formed so as to fill the concave portion, wherein a maximum inclination angle of a curved surface of the concave portion relative to a surface parallel to a surface of a substrate is an angle near a critical angle of a total reflection.

According to the arrangement of the present invention, since the maximum inclination angle of the curved surface of the interlayer lens is set to the angle near the critical angle of the total reflection, the inclination angle of the curved surface of the interlayer lens cannot exceed the critical angle of the total reflection at any portion so that an incident light can be prevented from being totally reflected on the curved surface of the interlayer lens and much more light can travel through this curved surface. Also, since the maximum inclination angle is in the proximity of the critical angle of the total reflection, focusing property of interlayer lens can be improved and much more light can be focused on the light-receiving portion.

According to other aspect of the present invention, in the solid-state imaging element, the angle near the critical angle of the total reflection is an angle which falls within a critical angle ±10° of the total reflection.

According to a further aspect of the present invention, in the solid-state imaging element, the maximum inclination angle of the curved surface of the interlayer lens is an angle near the critical angle of the total reflection in a cross-section of a short side direction of a sensor opening of a pixel.

DESCRIPTION OF THE PREFERRED EMBODIMENTS

The present invention will hereinafter be described in detail with reference to the drawings.

Figure 1:
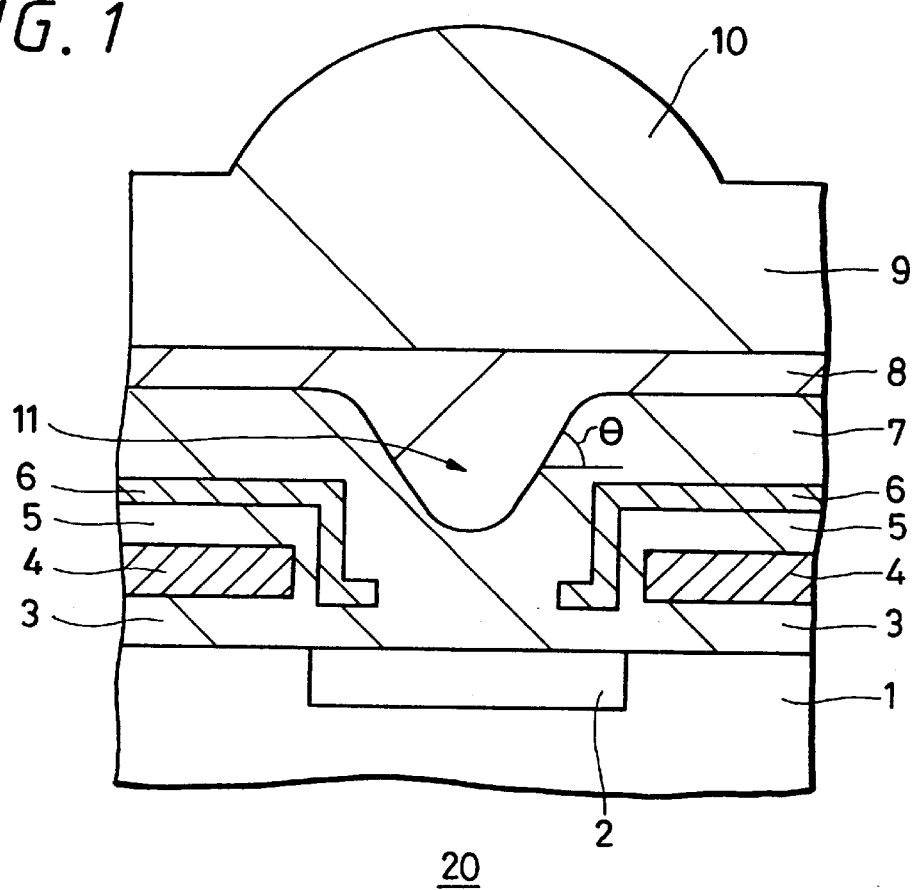
FIG. 1 is a schematic cross-sectional view illustrating a solid-state aging element according to an embodiment of the present invention.

FIG. 1 of the accompanying drawings is a schematic diagram (cross-sectional view of an element corresponding to one pixel) of a CCD solid-state imaging device as a solid-state imaging element according to an embodiment of the present invention.

As shown in FIG. 1, in a solid-state imaging element 20, a sensor (light-receiving portion) 2 is formed within a semiconductor substrate 1, and a transfer electrode 4 is formed on the semiconductor substrate 1 other than the light-receiving portion 2 through a gate insulating film 3. A light-shielding film 6 is formed on the transfer electrode 4 through an interlayer insulator film 5. This light-shelding film 6 is adapted to prevent a light from becoming incident on the transfer electrode 4. This light-shielding film 6 has an opening defined on the light-receiving portion 2 to permit a light to be introduced into the light-receiving portion 2.

Also, an interlayer insulator layer 7 made of BPSG (refractive index n=1.4 to 1.5) or the like and having concavities and convexities corresponding to stepped portions of the light-shielding film 6 is formed to cover the light-shielding film 6.

On the interlayer insulator layer 7, there is formed a high refractive index layer 8 made of a material such as an SiN film (refractive index n=1.9 to 2.0) or the like. An interface between the interlayer insulator layer 7 and the high refractive index layer 8 becomes a concave surface to configure a so-called interlayer lens 11 within the high refractive index layer 8. An incident light is refracted or reflected on this concave surface.

Incidentally, in order to focus the light on the light-receiving portion 2, the refractive index of the high refractive index layer 8 serving as an upper layer becomes larger than that of the interlayer insulator layer 7 under adjustment.

The upper surface of this high refractive index layer 8 is made flat and an upper insulating layer 9 is formed on the upper surface of the high refractive index layer 8. Within this upper insulating layer 9, there is formed a color filter or the like although not shown.

Further, on the uppermost portion of the layer 9, there is formed a microlens 10 for focusing an incident light on the light-receiving portion 2.

In this embodiment, in particular, a maximum inclination angle θ max of the curved surface of the interlayer lens 11 made of the high refractive index layer 8 relative to the surface parallel to the surface of the substrate, i.e. the surface of the semiconductor substrate 1 becomes an angle near a critical angle (c of a total reflection, e.g. an angle which falls within θc±10°.

Figure 2:
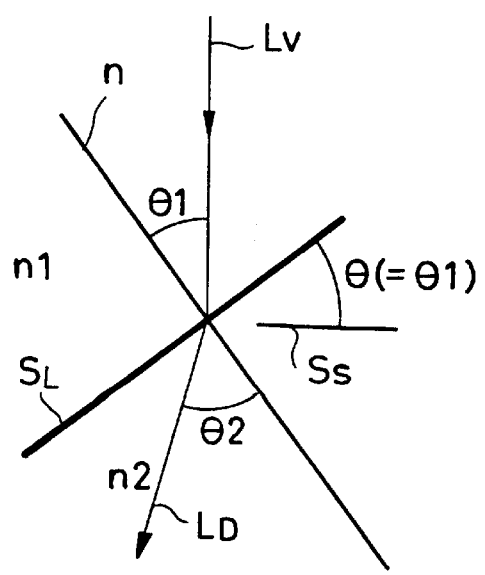
FIG. 2 is a schematic diagram showing a relationship between a light incident on the direction perpendicular to the surface of a substrate and a refracted light on the curved surface of an interlayer lens.

FIG. 2 is a schematic diagram showing a relationship between an incident light on the curved surface of interlayer lens 11 in the direction perpendicular to the substrate surface and its refracted light.

An inclination of a lens curved surface $S_L$ relative to the surface parallel to the substrate surface $S_S$ is assumed to be an inclination angle θ.

Let us consider a refraction of incident light (hereinafter referred to as vertical incident light) $L_V$ in the direction perpendicular to the substrate surface $S_S$. This vertical incident light $L_V$ includes an incident angle (1 relative to a normal n on the lens curved surface $S_L$. Also, since the vertical incident light LV and the substrate surface $S_S$ are perpendicular to each other, the inclination angle (of the lens curved surface $S_L$ agrees with the incident angle (1 of the vertical incident light $L_V$ (θ=θ1).

At that time, from a refractive index n1 of the interlayer lens 11 made of the light refractive index layer 8 on the light incident side and a refractive index n2 of the interlayer insulator layer 7 on the refraction side, a refraction angle (2 can be easily obtained based on Snell's law expressed by the following equation (1):

$$n1 \cdot \sin(\theta 1) = n2 \cdot \sin(\theta 2) \tag{1}$$

However, when the incident angle (1 of the vertical incident light LV is applicable to the condition expressed by the following expression (2), such condition becomes the total reflection condition so that the vertical incident light LV is totally reflected on the curved surface $S_L$ of the interlayer lens 11.

$$(n1/n2)\sin(\theta 1) > 1 \tag{2}$$

As mentioned before, an actual incident light is a collection of incident light components having different incident angles, and a range of its incident angle also changes depending upon a difference of F number of stop.

Figure 3:
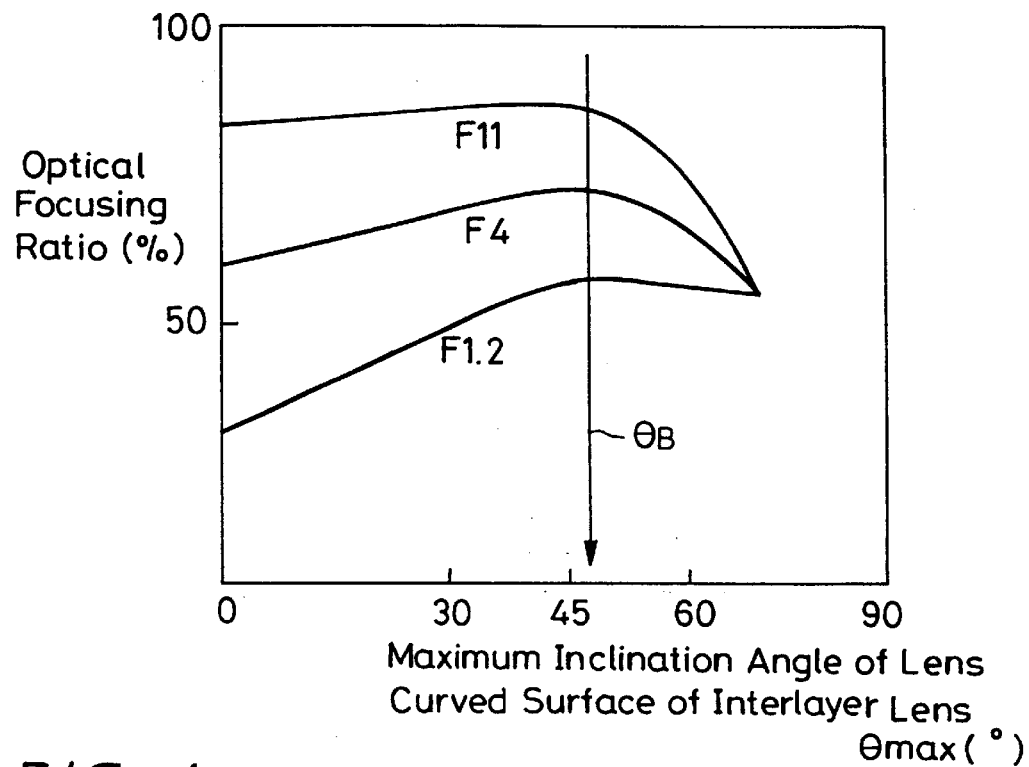
FIG. 3 is a diagram showing a dependence of an optical focusing ratio of an incident light relative to an inclination angle (of a curved surface of an interlayer lens with respect to three F numbers.

Having considered a relationship between the F number and sensitivity, a dependence of an optical focusing ratio of incident light relative to a maximum value of the inclination angle (of the curved surface $S_L$ of the interlayer lens 11, i.e. maximum inclination angle θ max were examined with respect to three F numbers (F=1.2, F=4, F=11). FIG. 3 shows measured results.

A study of FIG. 3 reveals that, when the stop is opened, i.e. F=1.2, the optical focusing ratio, i.e. sensitivity increases as the maximum inclination angle θ max increases.

When on the other hand the stop is closed, i.e. F=11, although the optical focusing ratio changes less when the inclination angle θ is held at a certain value and tends to fine increase as the inclination angle θ increases, the optical focusing ratio rapidly decreases, i.e. sensitivity is lowered when the inclination angle θ becomes larger than a certain value.

The reason for this is that, of the collection of the incident light components having the different incident angles, the incident light components in which the total reflection conditions can be established become dominant on the curved surface $S_L$ of the interlayer lens 11.

Also, a study of FIG. 3 reveals that, although F numbers are different, the inclination angles θ in which the optical focusing ratio is maximum and the sensitivity becomes maximum are substantially equal to each other. FIG. 3 shows the inclination angle θ in which the sensitivity becomes maximum as an optimum angle θB.

Here, when the F number is large, since the incident light is substantially represented by the vertical incident light $L_V$, if the inclination angle θ of the curved surface $S_L$ of the interlayer lens 11 is set in such a manner that the sensitivity becomes maximum relative to the vertical incident light $L_V$, then it is possible to obtain approximately satisfactory sensitivity.

Incidentally, depending upon the state in which the light is focused by the convex-shaped on-chip lens 10 of the upper layer, the incident angle θ1 on the curved surface $S_L$ of the interlayer lens 11 is changed variously. However, this can be approximately neglected when various incident angles θ1 are averaged.

In actual practice, FIG. 3 shows measured results obtained when the on-chip lens 10 of the upper layer is set to a certain state.

As described above, in order to maximize the sensitivity, the inclination angle θ of the curved surface $S_L$ of the interlayer lens 11 is set to an optimum angle θB shown in FIG. 3, for example, in such a manner that the sensitivity becomes maximum relative to the vertical incident light $L_V$. At that time, even when the F number is small, the sensitivity becomes substantially maximum similarly to the case in which the F number is large.

The optimum angle θB at which the sensitivity becomes maximum relative to the vertical incident light $L_V$ becomes approximately an angle near the critical angle θc of the total reflection in actual practice.

The critical angle θc of this total reflection is the incident angle θ1 at which θ2=90° is satisfied in the aforementioned equation (1), i.e. an angle which can satisfy the condition expressed by the following expression (3):

$$\sin θc = n2/n1 \text{ (where } n1>n2\text{)} \quad (3)$$

Then, when the incident angle satisfies θ1≧θc, the incident light is reflected totally.

It is to be understood that the curved surface SL of the interlayer lens 11 may be shaped in a range in which the maximum inclination angle (max is obtained in the proximity of the critical angle (c of this total reflection. At this time, the sensitivity becomes maximum for various type of incident lights.

When the interlayer lens 11, for example, is made of a plasma nitride film having a refractive index of about 2.0 and the interlayer insulator layer 7 on the lower layer of the sensor side is made of an $SiO_2$-based material having a refractive index of 1.45, the total reflection critical angle $θc=\sin^{-1} (1.45/2.0)=46°$. That is, the maximum inclination angle θ max is set to an angle near 46°.

Figure 4:
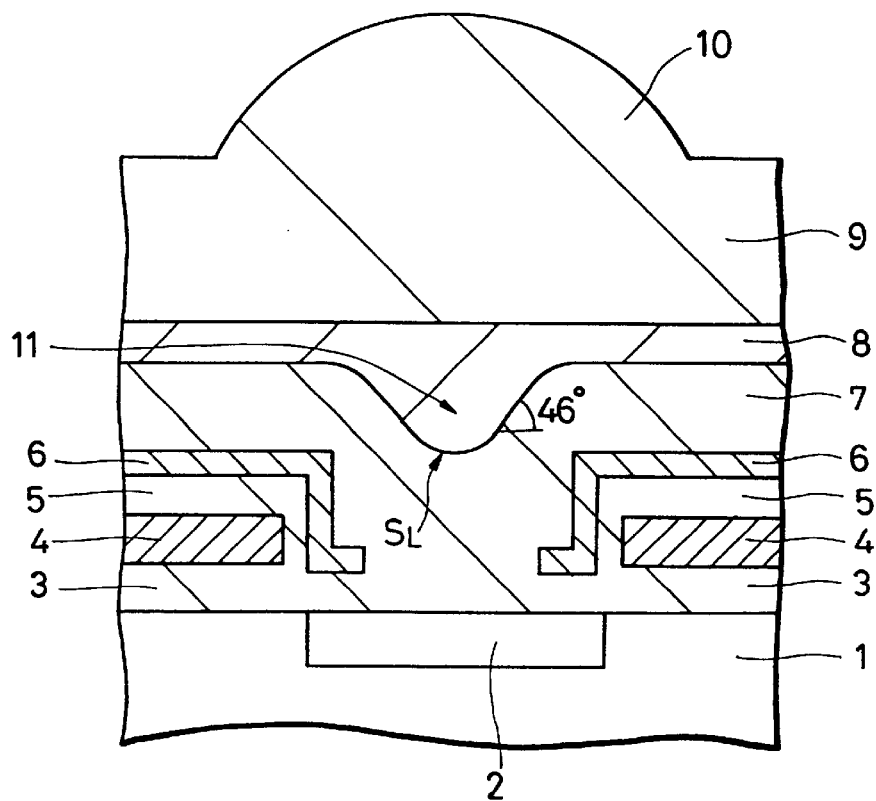
FIG. 4 is a cross-sectional view of a solid-state imaging element obtained when a maximum inclination angle of a curved surface of an interlayer lens is in the proximity of a critical angle of a total reflection (46( )

FIG. 4 is a cross-sectional view of an element corresponding to one pixel of a solid-state imaging element obtained when the maximum inclination angle θ max=46°.

Figure 5:
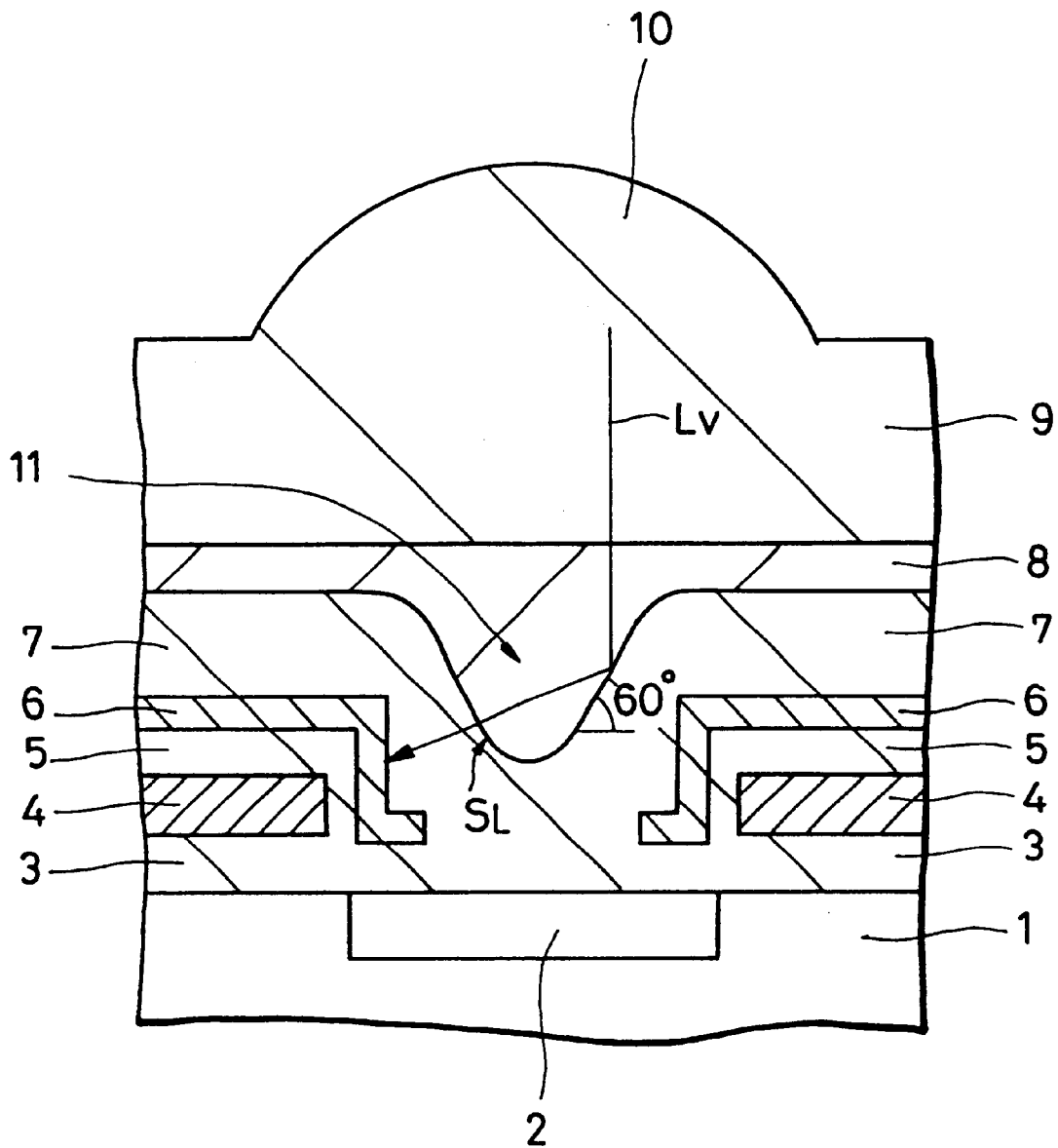
FIG. 5 is a cross-sectional view of a solid-state imaging element showing a light path of vertical incident light obtained when a maximum inclination angle of a curved surface of an interlayer lens is larger than a critical angle of a total reflection.

On the other hand, when the inclination angle θ is larger than the total reflection critical angle θc, e.g. inclination angle θ=60° as shown in FIG. 5, the vertical incident light LV is totally reflected on the curved surface $S_L$ of the interlayer lens 11 at its portion in which this inclination angle θ is large.

Accordingly, since a ratio in which the light is totally reflected on the whole of the curved surface $S_L$ of the interlayer lens 11 increases, the light incident on the light-receiving portion 2 decreases, thereby resulting in the sensitivity of the solid-state imaging element 20 being lowered.

Incidentally, if the maximum inclination angle θ max is made small, then a total reflection becomes difficult to occur. However, when F=1.2 as shown in FIG. 3, an optical focusing ratio is lowered. Therefore, it is not preferable that the maximum inclination angle θ max should be decreased.

Accordingly, the maximum inclination angle (max should be increased as much as possible in order to make the sensitivity become maximum and should be set to an angle near the total reflection critical angle θc.

According to the above-mentioned embodiment, the interlayer lens 11 can be shaped appropriately for various kinds of light sources in such a manner that the sensitivity can be made maximum.

Then, since the desired inclination angle (can be obtained based on the refractive index of the material of the interlayer lens 11 and the refractive index of the under layer thereof such as the interlayer insulator layer 7 or the like, trial products need not be manufactured repeatedly.

Also, it is possible to manufacture the solid-state imaging element 20 having desired characteristics with an excellent reproducibility.

Further, since the inclination angle and the shape of the optimum lens curved surface $S_L$ can be obtained from the refractive index of a changed material even though a material of the interlayer lens 11 is changed, it is possible to easily optimize the inclination angle and the shape of the lens curved surface $S_L$.

The maximum inclination angle Omax of the curved surface $S_L$ of the interlayer lens 11 is set to the angle near the above-mentioned total reflection critical angle θc by the following procedure, for example.

Initially, let us consider the conditions of the pixel and the conditions such as the opening width of the light-receiving portion 2 and the aspect ratio (ratio between the thickness of the whole layers of the solid-state imaging element 20 and the opening width of the light-receiving portion 2) or the like.

Then, the material of the interlayer insulator layer 7 of the under layer is selected, and by controlling a viscosity characteristic and a film thickness of the interlayer insulator layer 7 and a temperature of a heat treatment such as reflow or the like, it is possible to obtain a predetermined maximum inclination angle θ max.

When the interlayer insulator layer 7 is made of glass material such as BPSG or the like, for example, since the viscosity characteristic is changed depending upon the glass composition, the composition should preferably be changed in order to obtain a predetermined viscosity characteristic.

Also when the film thickness of the interlayer insulator layer 7 is decreased, the inclination angle θ of the curved surface $S_L$ of the interlayer lens 11 increases in response to the stepped portions of the light-shielding film 6.

When on the other hand the film thickness of the interlayer insulator layer 7 is increased, the stepped portions of the light-shielding film 6 are filled so that the inclination angle θ of the curved surface $S_L$ of the interlayer lens 11 decreases.

Subsequently, a solid-state imaging element according to another embodiment of the present invention will hereinafter be described below.

Figure 6B:
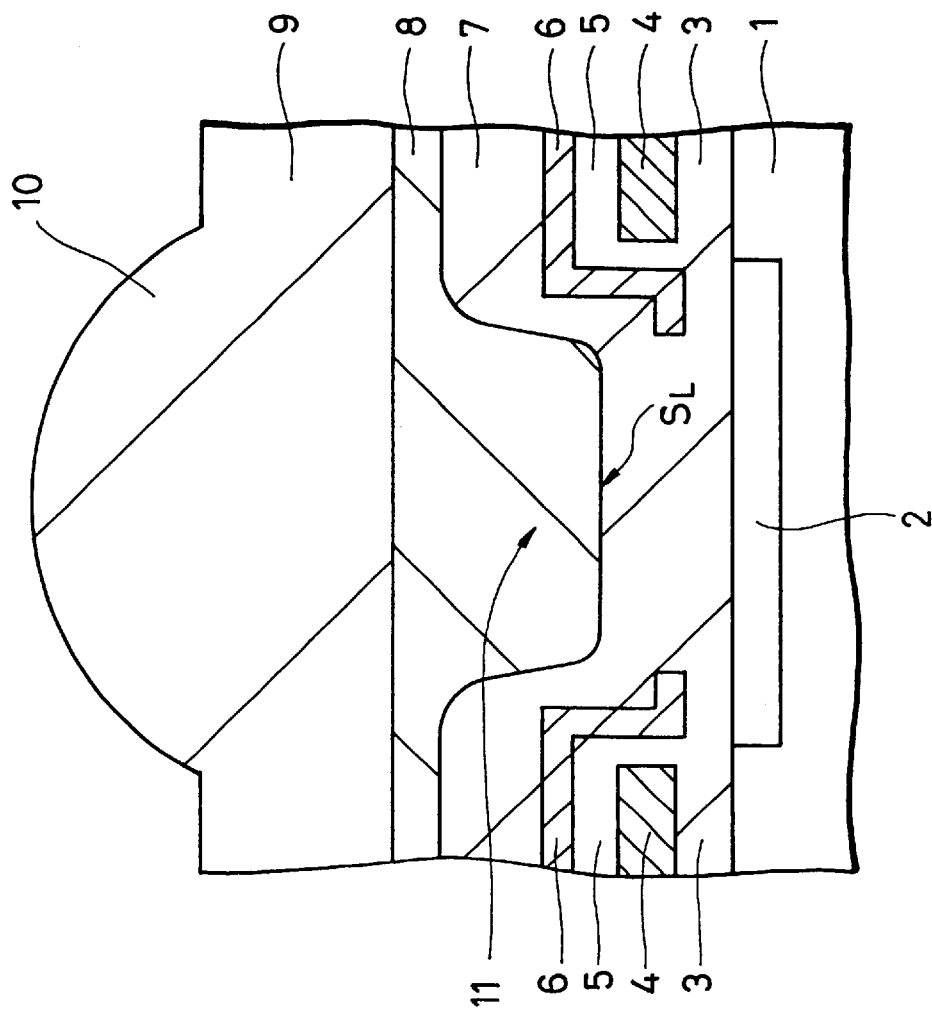
FIG. 6B is a cross-sectional view taken along the line A—A in FIG. 6A and illustrating an opening of a light-receiving portion in the long side direction thereof.
Figure 6A:
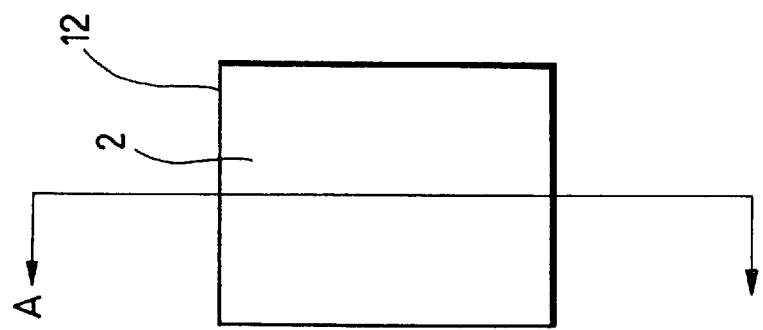
FIG. 6A is a plan view illustrating a shape of a light-receiving portion of a solid-state imaging element according to another embodiment of the present invention.

As shown in a plan view of FIG. 6A, in the solid-state imaging element according to this embodiment, the aspect ratio of the opening 12 of the sensor (light-receiving portion) 2 is not 1:1, i.e. in particular, the length of the long side and the length of the short side are considerably different from each other when there exist the long side and the short side in the light-receiving portion 2.

FIG. 6B is a cross-sectional view of the solid-state imaging element taken along the long side direction of the opening 12 of the light-receiving portion 2, i.e. a cross-sectional view taken along the line A—A in FIG. 6A.

In the long side direction, since the opening 12 formed by the light-shielding film 6 is wide, due to the feature of the material used in the interlayer insulator layer 7 of the under layer of the interlayer lens 11, as shown in FIG. 6B, the cross-section of the interlayer insulator layer 7 becomes substantially vertical because the inclination angle is large in the portion close to the light-shielding film 6 and becomes substantially horizontal because the inclination angle is small near the central portion of the opening 12.

That is, the cross-sectional shape of the interlayer insulator layer 7 and the shape of the curved surface $S_L$ of the interlayer lens 11 become pot-bottom shape.

When the shape of the curved surface $S_L$ of the interlayer lens 11 become like the pot-bottom as described above, the range of the inclination angle becomes very wide from approximately the horizontal direction (inclination angle 0°) to approximately the vertical direction (inclination angle 90°). As a result, the present invention is difficult to be applied to such case.

However, in the long side direction of the opening 12 of the light-receiving portion 2, since the opening 12 is wide enough to sufficiently receive the incident light, the optical focusing ratio of the interlayer lens 11 need not be increased too much. Therefore, the maximum inclination angle (max of the curved surface SL of the interlayer lens 11 need not be standardized with application of the present invention.

On the other hand, in the short side direction of the opening 12 of the light-receiving portion 2, since the opening 12 formed by the light-shielding film 6 is narrow, it is necessary to sufficiently introduce the incident light LV into the narrow opening 12 by increasing the optical focusing ratio.

Accordingly, when the aspect ratio of the opening 12 of the light-receiving portion 2 is not 1:1, i.e. there exist a long side and a short side, the present invention is applied to the short side direction of the opening 12 of the light-receiving portion 2, whereby the maximum inclination angle θ max of the curved surface SL of the interlayer lens 11 is set to the angle near the total reflection critical angle θc.

According to the above-mentioned arrangement, the optical focusing ratio in the short-side direction can be increased, and hence the sensitivity of the solid-state imaging element can be improved.

The solid-state imaging element according to the present invention is not limited to the above-mentioned embodiments and can take various arrangements without departing from the gist of the present invention.

According to the above-mentioned present invention, since the maximum inclination angle of the curved surface of the interlayer lens relative to the surface parallel to the substrate surface is set to the angle near the critical angle of the total reflection, the interlayer lens can be shaped in such a manner that the sensitivity may become maximum relative to various kinds of light sources.

Further, since the desired inclination angle can be obtained based on the refractive index of the material comprising the interlayer lens and the refractive index of the under layer such as the interlayer insulator layer or the like, trial products for determining the inclination angle need not be manufactured repeatedly, and the solid-state imaging element can be manufactured with an excellent reproducibility.

Furthermore, since the inclination angle and the shape of the optimum lens curved surface can be obtained from the refractive index even when the material of the interlayer lens is changed, it is possible to easily optimize the inclination angle and the shape of the optimum lens curved surface.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state imaging element comprising:
   a substrate layer having an upper surface; and
   an interlayer lens formed above the substrate layer and having at least one curved surface having an inclination angle ranging from a minimum to a maximum, the inclination angle defined by an angle between a tangent to the curved surface and the upper surface of the substrate;
   wherein the interlayer lens is characterized in that the maximum inclination angle of the curved surface of the interlayer lens is set to an angle near a critical angle of a total reflection, whereby incident light can be prevented from being totally reflected from the curved surface of the interlayer lens and more light can thereby travel through the curved surface.

2. A solid-state imaging element according to claim 1, wherein the angle near the critical angle of the total reflection is an angle which falls within +/−10° of the critical angle of the total reflection.

3. A solid-state imaging element according to claim 1, wherein the maximum inclination angle of the curved surface of the interlayer lens is an angle near the critical angle of the total reflection in a cross-section of a short side direction of a sensor opening of a pixel.

4. A solid-state imaging element comprising:
   a substrate having an upper surface;
   a light-receiving portion formed within the substrate;
   an interlayer insulator layer formed so as to have a concave portion above the light-receiving portion; and
   a high refractive index layer having a refractive index larger than that of the interlayer insulator formed so as to fill the concave portion;
   an inclination angle ranging from a minimum to a maximum, the inclination angle defined by an angle between a tangent to the concave portion and the upper surface of the substrate;
   wherein the maximum inclination angle is an angle near a critical angle of a total reflection, whereby incident light can be prevented from being totally reflected from the concave portion and more light can thereby travel through the curved surface.

5. A solid-state imaging element according to claim 4, wherein the critical angle of the total reflection is a value calculated as sin-1(n2/n1) where n1 is a refractive index of the high refractive index layer and n2 is a refractive index of the interlayer insulator.

* * * * *